(12) United States Patent
Park et al.

(10) Patent No.: US 7,402,468 B2
(45) Date of Patent: Jul. 22, 2008

(54) FLAT PANEL DISPLAY AND METHOD OF FABRICATING THE SAME

(75) Inventors: Sang-Il Park, Suwon-si (KR); Jae-Bon Koo, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/832,099

(22) Filed: Aug. 1, 2007

(65) Prior Publication Data

US 2007/0269939 A1 Nov. 22, 2007

Related U.S. Application Data

(62) Division of application No. 10/995,147, filed on Nov. 24, 2004, now Pat. No. 7,268,405.

(30) Foreign Application Priority Data

Nov. 29, 2003 (KR) .................. 10-2003-087793

(51) Int. Cl.
*H01L 21/00* (2006.01)
(52) U.S. Cl. ...................... 438/151; 438/514
(58) Field of Classification Search ............. 438/151, 438/155, 514
See application file for complete search history.

(56) References Cited

U.S. PATENT DOCUMENTS

| 6,096,585 | A | 8/2000 | Fukuda et al. | |
|---|---|---|---|---|
| 6,469,317 | B1 | 10/2002 | Yamazaki et al. | |
| 6,476,416 | B1 | 11/2002 | Ikeda | |
| 6,936,844 | B1 | 8/2005 | Yamazaki et al. | |
| 7,268,405 | B2 * | 9/2007 | Park et al. | 257/412 |
| 2001/0032981 | A1 | 10/2001 | Kong et al. | |

FOREIGN PATENT DOCUMENTS

| CN | 1276622 | 12/2000 |
|---|---|---|
| KR | 10-0209620 | 4/1999 |
| KR | 10-2000-0076954 | 12/2000 |

\* cited by examiner

*Primary Examiner*—Mark Prenty
(74) *Attorney, Agent, or Firm*—H.C. Park & Associates, PLC

(57) ABSTRACT

Disclosed is a flat panel display which comprises a substrate; a gate line formed on the substrate along a predetermined direction; and a gate electrode electrically connected to the gate line, and having a sheet resistance different from the gate line. With this configuration, a wiring resistance of the gate line can be lowered with minimizing the change of the process and without increasing the thickness of the gate line.

16 Claims, 8 Drawing Sheets

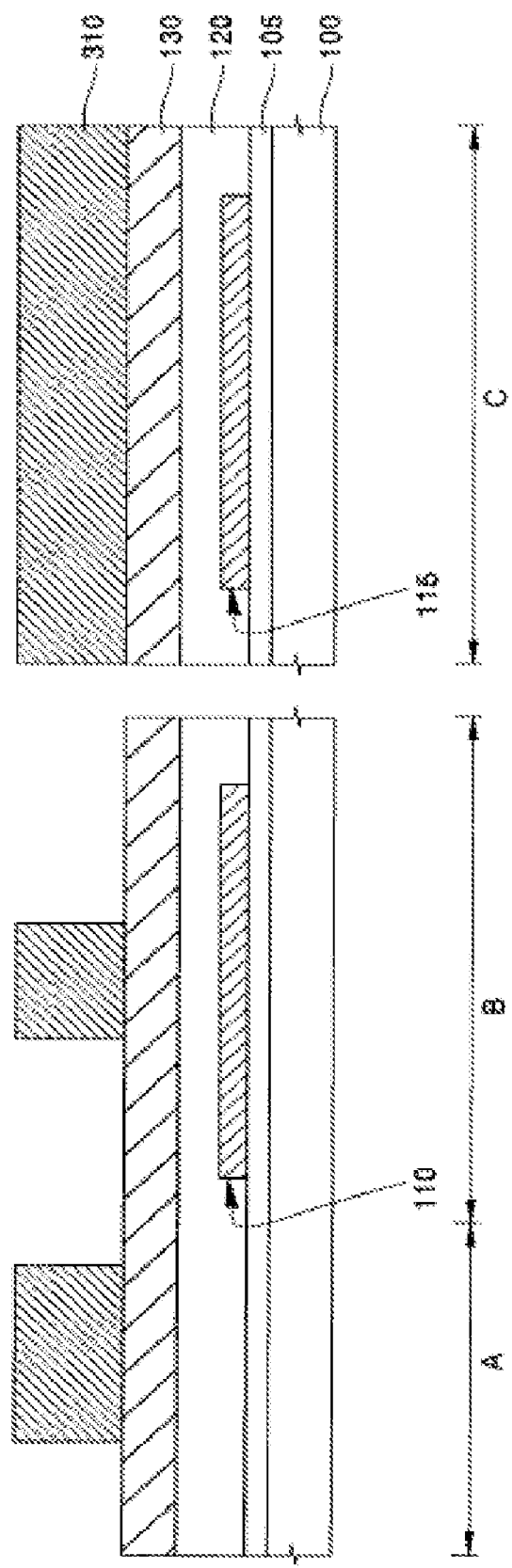

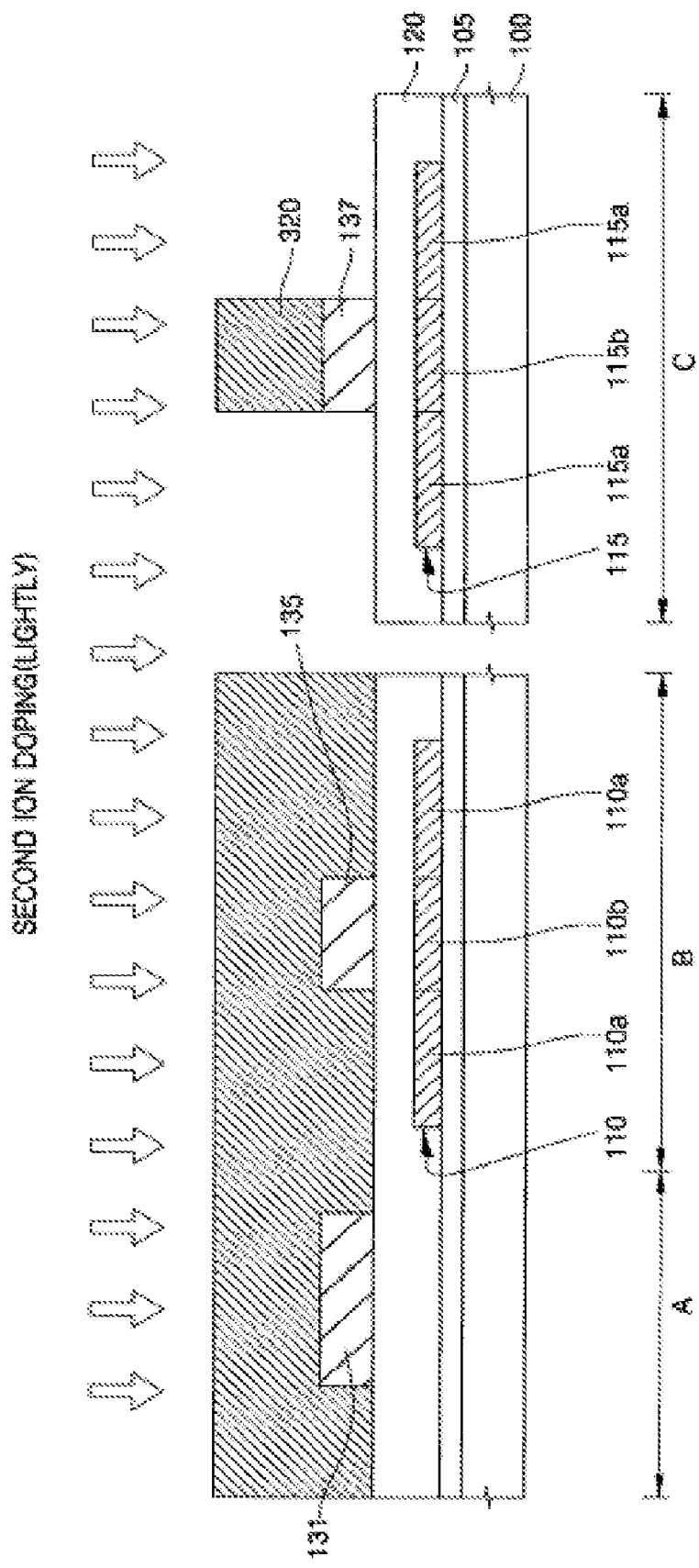

FLAT PANEL DISPLAY AND METHOD OF FABRICATING THE SAME

CROSS-REFERENCE TO RELATED APPLICATION

This application is a divisional of prior U.S. patent application Ser. No. 10/995,147, filed on Nov. 24, 2004, now U.S. Pat. No. 7,268,405 and claims the benefit of Korean Patent Application No. 10-2003-0087793 filed on Nov. 29, 2003, both of which are hereby incorporated by reference for all purposes as if fully set forth herein.

BACKGROUND OF THE INVENTION

1. Field of the Invention

The present invention relates to a flat panel display and method of fabricating the same and, more particularly, to an active matrix flat panel display and method of fabricating the same.

2. Description of the Related Art

An active matrix flat panel display can be provided with pixels arranged in a matrix form. In an active matrix flat panel display, the pixel generally comprises at least one thin film transistor, a pixel electrode controlled by the thin film transistor, and an opposite electrode corresponding to the pixel electrode. If an organic emission layer is interposed between the pixel electrode and the opposite electrode, the device is typically described as an organic light-emitting device, whereas if a liquid crystal layer is interposed therebetween, the device is typically called a liquid crystal display.

Such an active matrix flat panel display typically comprises pixels defined by a plurality of gate lines and a plurality of data lines. The pixels can be arranged in a matrix form, and the matrix-like arranged pixels may be referred to as a pixel array. A gate driving circuit applying scan signals to the gate lines in sequence and a data driving circuit applying data signals to the data lines may be placed in the periphery of the pixel array.

Here, the wiring resistance of the gate line can cause the scan signal applied from the gate driving circuit to the gate line to be delayed. Further, the delay of the scan signal can deteriorate the picture quality at the pixels positioned far from the gate driving circuit. Hence, as the flat panel device becomes large, this problem can seriously affect the quality of the image on the flat panel display.

To solve the foregoing problems, another gate driving circuit can additionally be provided in the periphery of the pixel array. Thus one gate line can receive the scan signal from two gate driving circuits at both sides. However, this structure can increase the size of the panel.

Alternatively, to solve the foregoing problems, the gate line may be made thicker, thereby reducing its sheet resistance. However, a thick gate line can cause stress imbalance with other layers.

SUMMARY OF THE INVENTION

The present invention can provide a flat panel display in which a voltage drop in a gate line is decreased. It can also provide a method for making such a flat panel display.

A flat panel display can include a substrate, a gate line formed on the substrate along a predetermined direction, and a gate electrode electrically connected to the gate line. The gate electrode may have a different sheet resistance than the gate line.

A flat panel display can alternatively include a substrate, a gate line formed on the substrate along a predetermined direction, and a gate electrode electrically connected to the gate line. The gate line may have been doped with ions.

A method of fabricating a flat panel display may include providing a substrate having a wiring region and a first transistor region, forming a first active layer on the first transistor region, forming a gate line and a first gate electrode in the wiring region and the first transistor region, respectively. It may also include doping the gate line with ions while masking the first gate electrode.

BRIEF DESCRIPTION OF THE DRAWINGS

FIGS. 2A, 2B, 2C, 2D, and 2E are cross-sectional views for illustrating a method of fabricating an organic light-emitting device according to an embodiment of the present invention.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 1:
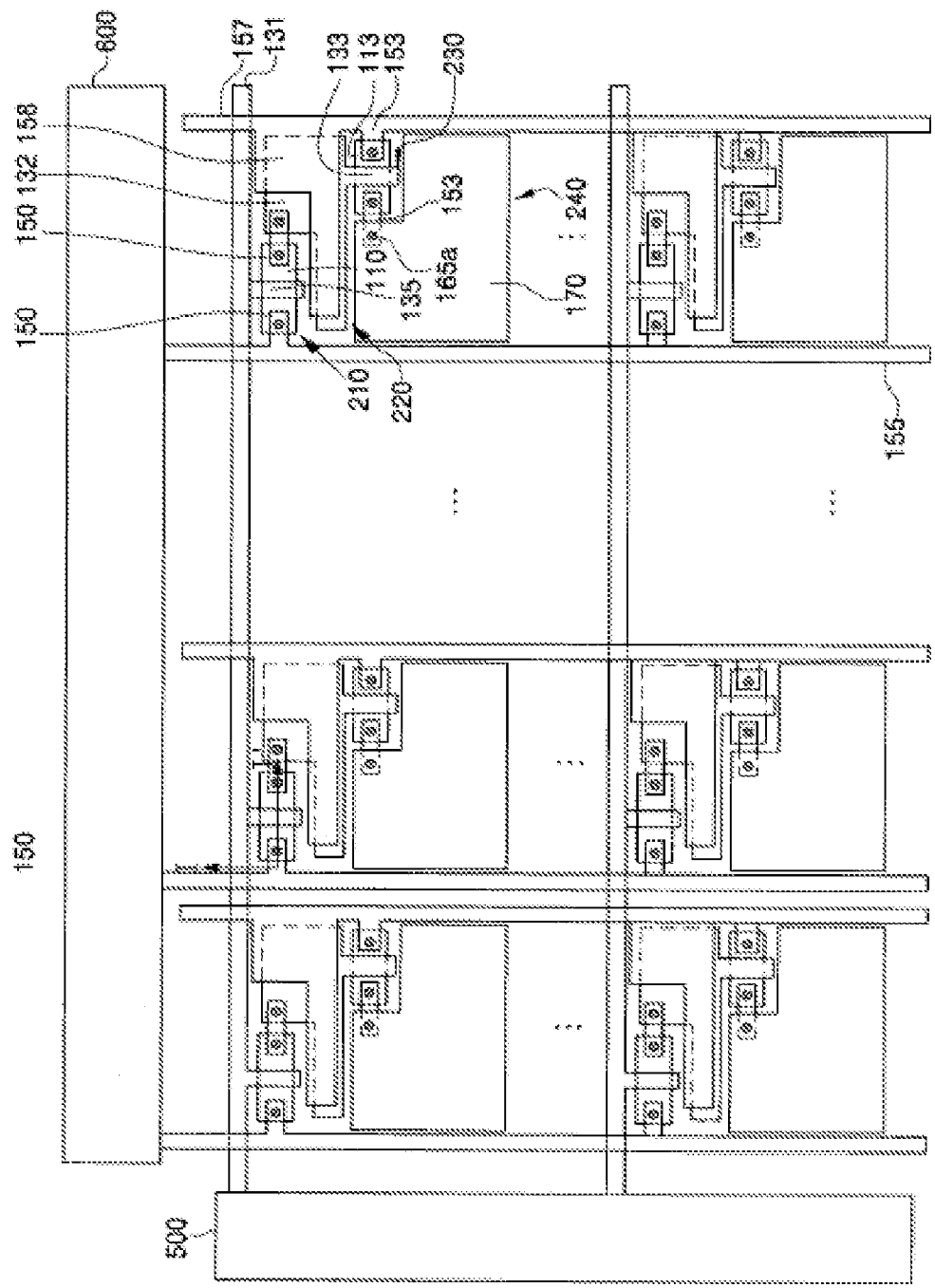
FIG. 1 is a plan view of an organic light-emitting device according to an embodiment of the present invention.

As shown in FIG. 1, a plurality of gate lines 131 may be arranged in a predetermined direction. A plurality of data lines 155 may be arranged in a direction crossing the gate lines 131. The data lines 155 and the gate lines 131 may be insulated from each other. A plurality of common power lines 157 may be arranged in a direction crossing the gate line 131 and parallel with the data lines 155. The common power lines 157 and the gate lines 131 may be insulated from each other.

The plurality of gate lines 131, the plurality of data lines 155, and the plurality of common power lines 157 may define pixels arranged in a matrix form. The matrix-like arrangement of pixels may be called a pixel array. Each pixel may include a switching thin film transistor 210, a driving thin film transistor 230, a capacitor 220, and an organic light-emitting diode 240.

The switching thin film transistor 210 may include a semiconductor layer 110 having source/drain regions; a gate electrode 135 connected to the gate line 131; and source/drain electrodes 150 connected to the source/drain regions of the semiconductor layer 110 via a contact hole. Further, the driving thin film transistor 230 may include a semiconductor layer 113 having source/drain regions, a gate electrode 133, and source/drain electrodes 153 connected to the source/drain regions of the semiconductor layer 113 via a contact hole.

The capacitor 220 may include a lower electrode 132 connected to the gate electrode 133 of the driving thin film transistor 230. It may also be connected to one of the source/drain electrodes 150 of the switching thin film transistor 210 via the contact hole. The capacitor 220 may also include an upper electrode 158 connected to one of the source/drain electrodes 153 of the driving thin film transistor 230 via the contact hole and the common power line 157. A pixel electrode 170 may be connected to the other of the source/drain electrode 153 of the driving thin film transistor 230 through a via hole 165a.

A gate driving circuit 500 applying scan signals to the gate lines 131 in sequence, and a data driving circuit 600 applying data signals to the data lines 155 may be placed in the periphery of the pixel array.

The gate line 131 may be ion doped thereby providing it with a low wiring resistance. This low wiring resistance may lower the voltage drop in the gate line 131. Further, the gate line 131 may have a low wiring resistance as compared with the gate electrode 135 of the switching thin film transistor 210 and the gate electrode 133 of the driving thin film transistor 230.

As shown in FIG. 2A, a substrate 100 can include a wiring region (A), a first transistor region (B) and a second transistor region (C). The wiring region (A) may be a region on which the gate line may be formed. The first transistor region (B) may be a region on which the switching thin film transistor may be formed. The second transistor region (C) may be a partial circuit region on which a circuit thin film transistor with a type different from the switching thin film transistor may be formed.

A buffer layer 105 may be formed on the substrate 100. The buffer layer 105 may protect the thin film transistor from impurities emitted from the substrate 100. The buffer layer 105 can be made of a silicon oxide layer, a silicon nitride layer, or a stacked multi-layer thereof.

A first active layer 110 and a second active layer 115 may be formed on the buffer layer 105 of the first and second transistor regions (B, C). The first and second active layers 110 and 115 can be made of amorphous silicon or polycrystalline silicon. A gate insulating layer 120 may be formed on substantially the entire surface of the substrate 100 including the first and second active layers 110 and 115. A conductive layer 130 may be formed on the gate insulating layer 120.

The conductive layer 130 may preferably be made of one or more of the following: aluminum (Al), aluminum alloy, molybdenum (Mo), and molybdenum alloy. A particularly suitable molybdenum alloy may be a molybdenum-tungsten alloy. Further, the conductive layer 130 may be about 150 to about 400 nm thick. Such a thickness may help to ensure that the gate wiring formed in the process described below has the proper wiring resistance.

A first photoresist pattern 310 covering a predetermined portion of the wiring region (A) may be formed on the conductive layer 130, a portion of the first active layer 110 excluding the ends thereof, and the whole area of the second transistor region (C).

Figure 2B:
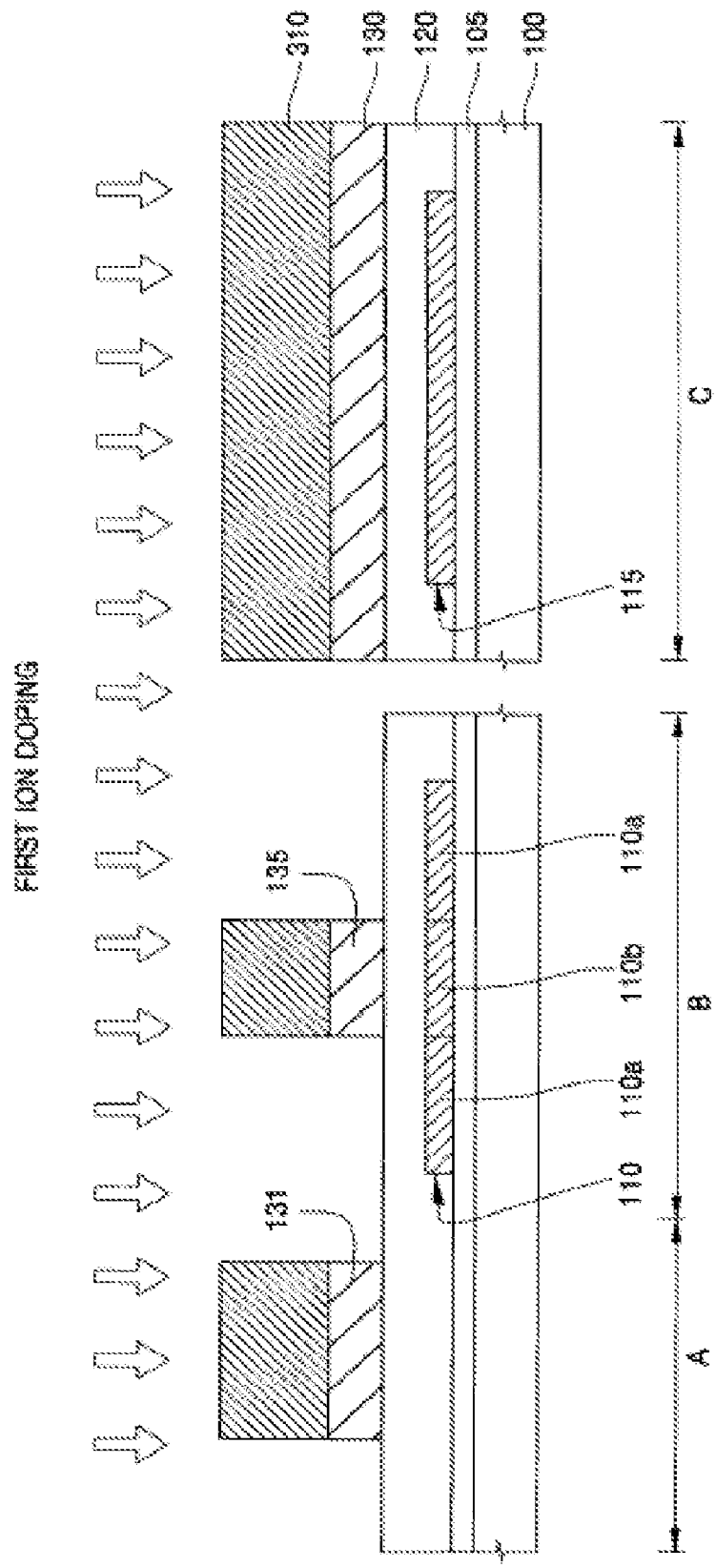

As shown in FIG. 2B, the conductive layer 130 may be etched using the first photoresist pattern 310 as a mask. Thus a gate line 131 and a first gate electrode 135 may be formed on the wiring region (A) and the first transistor region (B), respectively. Using the first photoresist pattern 310 and the first gate electrode 135 as a mask, both ends of the first active layer 110 may be doped with a first ion so that first source/drain regions 110a are formed at both ends of the first active layer 110. Thus, a first channel region 10b interposed between the first source/drain regions 10a may be defined.

The doping process may be performed using an ion-showering method. An ion-showering method may allow the ions to be active at a low temperature as compared with a temperature of ion implantation method. Additionally, in this method, discharged particles may be accelerated and injected without mass separation. Hence, during the ion-doping process, a significant amount of hydrogen ions may permeate into a film.

The first ion may be doped by ion-showering with the first photoresist pattern 310 thickly left on the first gate electrode 135. Therefore the gate insulating layer 120 and the first semiconductor layer 110 under the first gate electrode 135 may be protected from having the hydrogen ion injected into them.

Thus, the gate insulating layer 120 and the first semiconductor layer 110 can keep their layer properties and their interface properties. Further, the threshold voltage, electron mobility, and reliability of the thin film transistor may improve. For this, the first photo resist pattern 310 may be about 5000 Å or more thick.

As shown in FIG. 2C, after the first photoresist pattern 310 of FIG. 2B is removed, a second photoresist pattern 320 may be formed completely covering the wiring region (A) and the first transistor region (B) and covering the conductive layer 130 except for both ends of second active layer 115. Then, the conductive layer 130 may be etched using the second photoresist pattern 320 as a mask, thereby forming a second gate electrode 137.

Using the second photoresist pattern 320 and the second gate electrode 137 as a mask, both ends of the second active layer 115 may be lightly doped with a second ion. Thus lightly-doped source/drain regions 115a may be formed at both ends of the second active layer 115. Thus, a second channel region 115b interposed between the lightly-doped source/drain regions 115a may be defined. The second ion preferably may have a type different from the first ion. For example, the first ion may be a p-type, and the second ion may be an n-type.

Like the first ion doping process, the doping process may be performed using ion-showering method. The second ion may be doped by ion-showering with the second photoresist pattern 320 thickly remaining on the second gate electrode 137. Thus the gate insulating layer 120 and the second semiconductor layer 115 under the second gate electrode 137 may be protected from hydrogen ion injecting. Similarly, the second photo resist pattern 320 may be about 5000 Å or more thick.

Figure 2D:
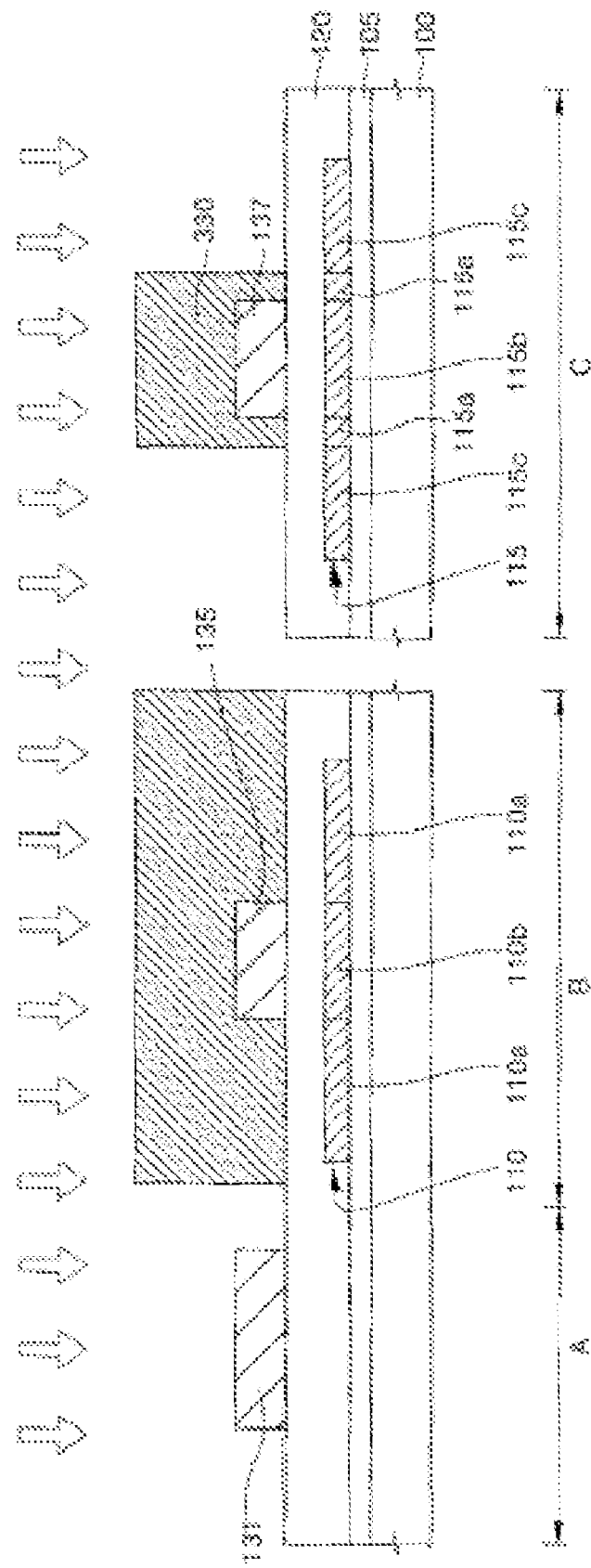

As shown in FIG. 2D, the second photoresist pattern 320 of FIG. 2C may be removed. Next, a third photoreist pattern 330 may be formed exposing the wiring region (A), but completely covering the first transistor region (B) as well as the second gate electrode 137 and its lateral sides. Using the third photoresist pattern 330 as a mask, the gate line 131 and the second active layer 115 may be highly doped with the second ion. Thus highly-doped source/drain regions 115c may be formed in the second active layer 115. To make the highly doped source/drain region 115c have proper electric conductivity, the second ion may preferably be injected with about 3.0E15 ions/cm$^2$ to about 5.0E15 ions/cm$^2$. The doping process may be performed using ion-showering.

At this time, the gate line 131 may be doped with the second ion. Thus the wiring resistance can be low. The gate electrodes 135 and 137 may be masked by the foregoing photoresist patterns 310, 320, and 330 in the above-described ion doping process. Thus they may not be doped with ions. Hence, the wiring resistance of the gate line 131 may be low compared to that of the gate electrodes 135 and 137. Thus, a voltage drop in the gate line 131 may be effectively eliminated, and noticeable signal delay may be prevented.

Figure 2E:
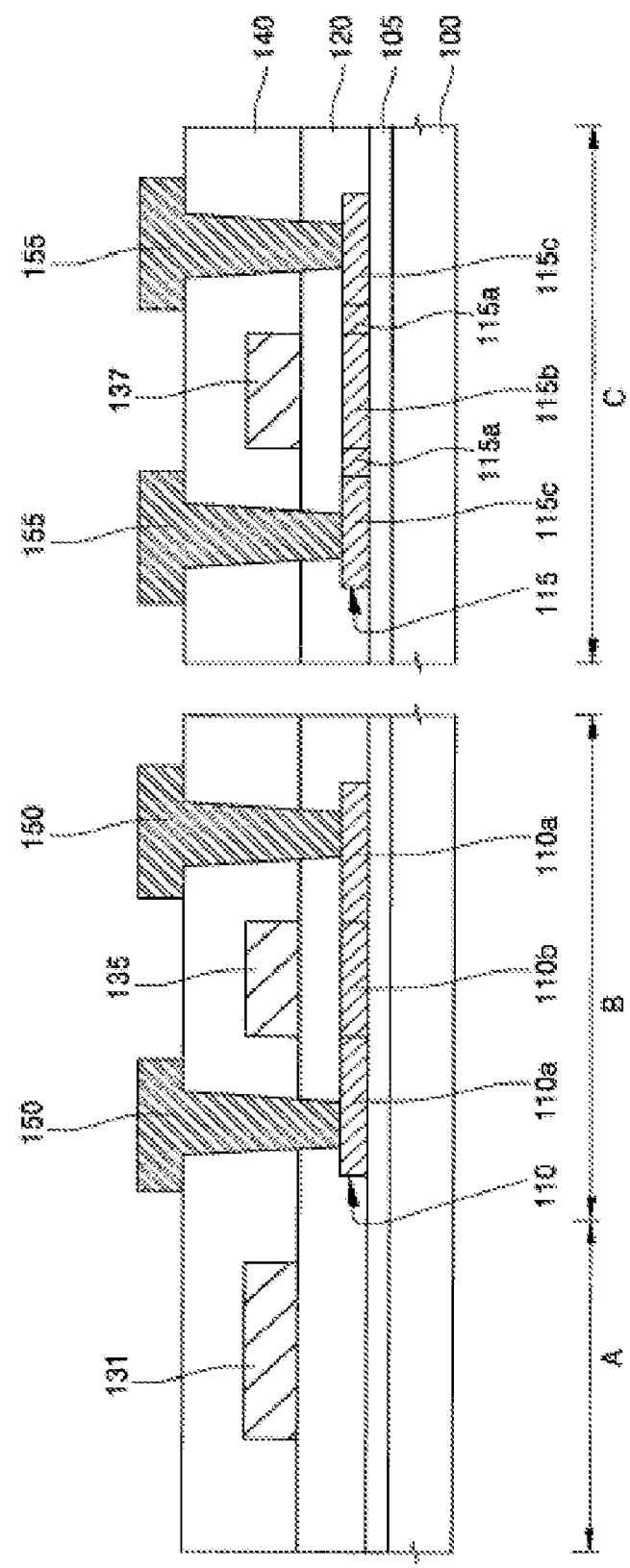

As shown in FIG. 2E, the third photoresist pattern 330 of FIG. 2D may be removed exposing the gate electrodes 135 and 137. An interlayer 140 may be formed on the exposed gate electrodes 135 and 137. The interlayer 140 may preferably be made of silicon oxide.

Next, a contact hole may be formed in the interlayer 140, and source/drain electrode materials may be laminated over the interlayer 140. Then, the laminated source/drain electrode materials may be patterned to form a first source/drain electrode 150 and a second source/drain electrode 155 on the interlayer 140. The first and second source/drain electrodes 150 and 155 may be in contact with the first and second active layers 110 and 115, respectively, through the contact hole.

Thereafter, sequential processes may be performed by any suitable method (such as a typical conventional method), thereby fabricating the organic light-emitting device.

Figure 3:
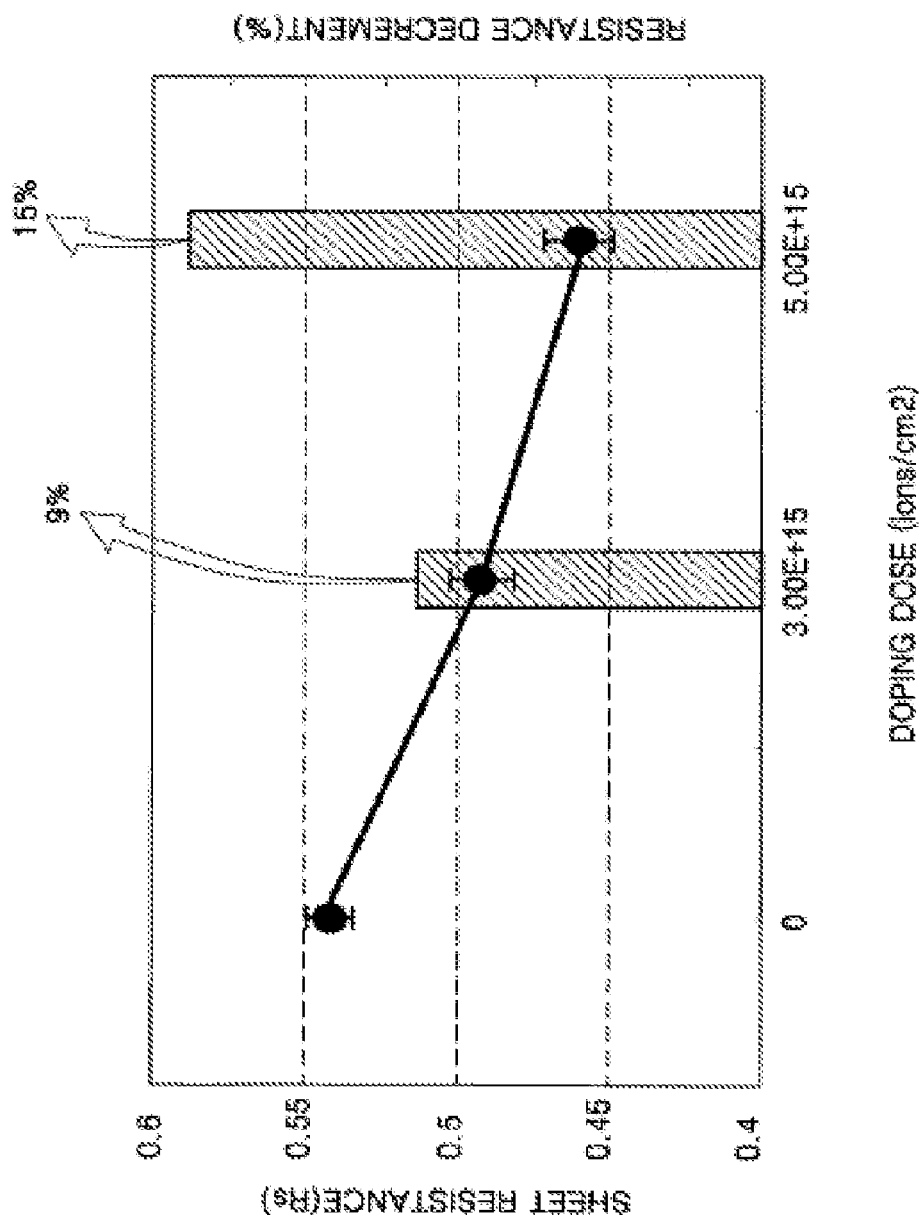
FIG. 3 is a graph showing a sheet resistance change of a gate line to the dose of an ion implantation.

As shown in FIG. 3, the more the dose of ion doping increases, the more the sheet resistance of the gate line decreases. However, the sheet resistance of the gate line may decrease by about 9% to about 15% when the dose of ion implantation is in a range of between about 3.0E15 ions/$cm^2$ and about 5.0E15 ions/$cm^2$. Such a range may be a proper dose of ion implantation for forming the source/drain region on the semiconductor layer. Consequently, the sheet resistance of the gate line may be about 85% to about 91% as compared with that of the gate electrodes 135 and 137 of FIG. 2E which are not doped with ions.

Figure 4:
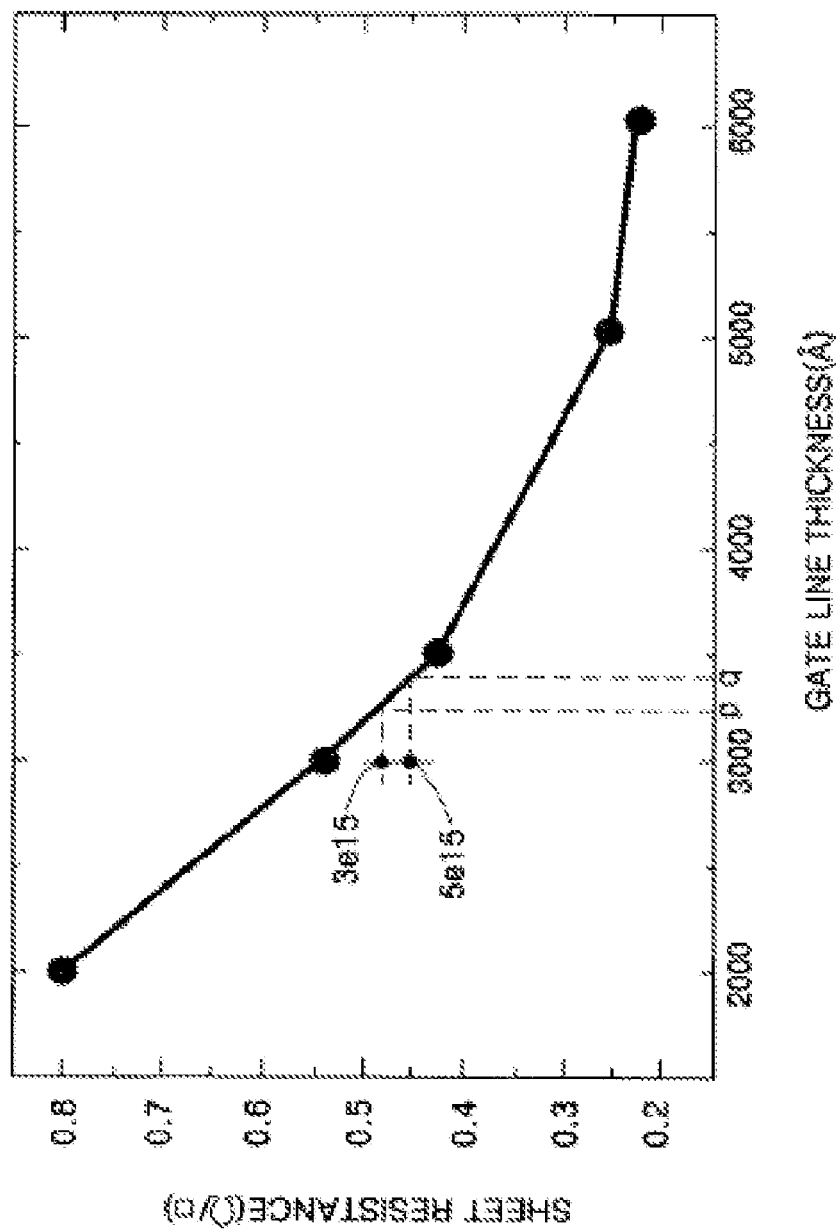
FIG. 4 is a graph showing an estimated thickness of the gate line with the decreased sheet resistance.

As shown in FIG. 4, when the dose of ion implantation is about 3.0E15 ions/$cm^2$, the sheet resistance of the gate line may decrease by 9%. This may have the same effect as the gate line having a thickness of about 3000 Å (at a point of 'p'). Similarly, when the dose of ion implantation is about 5.0E15 ions/$cm^2$, the sheet resistance of the gate line may decrease by 15%. This may have the same effect as the gate line having a thickness of about 3800 Å (at a point of 'q'). By way of comparison, the thickness of the gate line doped with the ions may substantially be about 2000 Å. Therefore, the voltage drop may be prevented without increasing the thickness of the gate line.

As described above, the wiring resistance of a gate line can be selectively lowered while minimizing the change of the process and without increasing the thickness of the gate line. Further, a semiconductor layer may be doped with ions by ion-showering using a photoreist pattern and a gate electrode as a mask. Thus a thin film transistor may be saved from deterioration.

While the present invention has been described with reference to a particular embodiment, the disclosure has been made for purpose of illustrating the invention by way of examples and not to limit the scope of the invention. One skilled in the art can change the described embodiments without departing from the scope of the invention.

What is claimed is:

1. A method for fabricating a flat panel display, comprising:
   forming a first active layer on a first transistor region of a substrate;
   forming a gate line in a wiring region of the substrate;
   forming a first gate electrode in the first transistor region; and
   ion doping the gate line while the first gate electrode and the entire first active layer are masked.

2. The method of claim 1, wherein ion doping comprises:
   forming a photoresist pattern covering an entire surface of the first active layer and exposing the gate line; and
   ion doping the gate line using the photoresist pattern as a mask.

3. The method of claim 2, wherein the photoresist pattern is at least 5000 Å thick.

4. The method of claim 1, wherein forming a gate line and a first gate electrode comprises:
   laminating a gate insulating layer and a conductive layer on an entire surface of the substrate having the first active layer;
   forming a photoresist pattern on the conductive layer covering the wiring region and a portion of the first active layer excluding a plurality of ends thereof; and
   etching the conductive layer using the photoresist pattern as a mask.

5. The method of claim 4, wherein the photoresist pattern is at least about 5000 Å thick.

6. The method of claim 4, further comprising:
   ion doping the plurality of ends using the photoresist pattern and the first gate electrode as a mask; and
   removing the photoresist pattern.

7. The method of claim 1, wherein ion doping comprises ion showering.

8. The method of claim 1, wherein the gate line and the first gate electrode are approximately the same thickness.

9. The method of claim 1, wherein the gate line and the first gate electrode comprise molybdenum-tungsten alloy.

10. The method of claim 1, wherein the gate line and the first gate electrode are each between about 150 nm and about 400 nm thick.

11. The method of claim 1, further comprising:
    forming a second active layer on a second transistor region of the substrate; and
    forming a second gate electrode in the second transistor region after forming the gate line and the first gate electrode.

12. The method of claim 11, wherein forming a second gate electrode comprises:
    forming a photoresist pattern on the wiring region, the first transistor region, and a portion of the second active layer excluding a plurality of ends thereof; and
    etching a conductive layer using the photoresist pattern as a mask.

13. The method of claim 12, wherein the photoresist pattern is at least about 5000 Å thick.

14. The method of claim 12, further comprising:
    ion doping the plurality of ends using the photoresist pattern and the second gate electrode as a mask; and
    removing the photoresist pattern.

15. The method of claim 12, wherein ion doping comprises:
    forming a photoresist pattern covering the second gate electrode and an entire surface of the first active layer and exposing the gate line and a portion of the second active layer; and
    ion doping the gate line and the portion of the second active layer using the photoresist pattern as a mask.

16. The method of claim 15, wherein the photoresist pattern is at least 5000 Å thick.

* * * * *